July 25, 1961 B. FOX 2,994,056

PRINTED CIRCUIT BOARD CONNECTOR

Filed Dec. 13, 1955 4 Sheets-Sheet 1

INVENTOR.

BENJAMIN FOX

BY Harry Langsam

ATTORNEY

July 25, 1961 B. FOX 2,994,056

PRINTED CIRCUIT BOARD CONNECTOR

Filed Dec. 13, 1955 4 Sheets-Sheet 2

INVENTOR.
BENJAMIN FOX

BY Harry Langsam
ATTORNEY

PRINTED CIRCUIT BOARD CONNECTOR

Filed Dec. 13, 1955 4 Sheets-Sheet 3

*INVENTOR.*

BENJAMIN FOX

*BY* Harry Langsam

ATTORNEY

INVENTOR.
BENJAMIN FOX

BY Harry Langsam

ATTORNEY

United States Patent Office 2,994,056
Patented July 25, 1961

2,994,056
PRINTED CIRCUIT BOARD CONNECTOR

Benjamin Fox, 268 E. Durard St., Philadelphia, Pa.

Filed Dec. 13, 1955, Ser. No. 552,743
11 Claims. (Cl. 339—17)

My invention relates to a quick detachable connector, and relates more particularly to a quick detachable connector for printed circuits.

The present invention is an improvement upon the inventions of my prior issued Patent No. 2,502,253—Re. 23,547.

When frequent connections are made and broken with a printed circuit board, the conductive strips unduly wear, thereby resulting in poor electrical contacts between the printed circuit board and the quick detachable connector. Furthermore, the variation in thickness and warpage inherent in the printed circuit board causes poor or intermittent contact. To prevent this and to avoid the wearing of the conductive strips on a printed circuit board, an electrical contact or connector is affixed to the circuit board according to the present invention, in good electrical engagement with the conductive strip, and the electrical connector is joined to the contacts affixed to the circuit board, but with the printed circuit board serving as the aligning guide for the electrical contacts, thus making contact independent of variations, warpages, or wear of the printed circuit board.

It, therefore, is an object of my invention to provide a quick detachable connector for a printed circuit board which may be made of any number of electrical contacts.

Another object of my invention is to provide a quick detachable connector for a printed circuit board which readily connects with complementary, relatively heavy, metal contacts mounted upon the conductive strips.

Another object of my invention is to provide a quick detachable connector for a printed circuit board having a plurality of identically constructed electrical contacts and insulator casing members in which the contacts are held.

Another object of my invention is to provide an integrally molded connector wherein a plurality of tiers of contacts are arranged, wherein the contacts are staggered in different planes, but wherein the contacts may be in the same tier.

Other objects of my invention are to provide an improved device of the character described, that is easily and economically produced, which is sturdy in construction, and which is highly efficient in operation.

With the above and related objects in view, my invention consists in the details of construction and combination of parts, as will be more fully understood from the following description, when read in conjunction with the accompanying drawings, in which.

Figure 1:
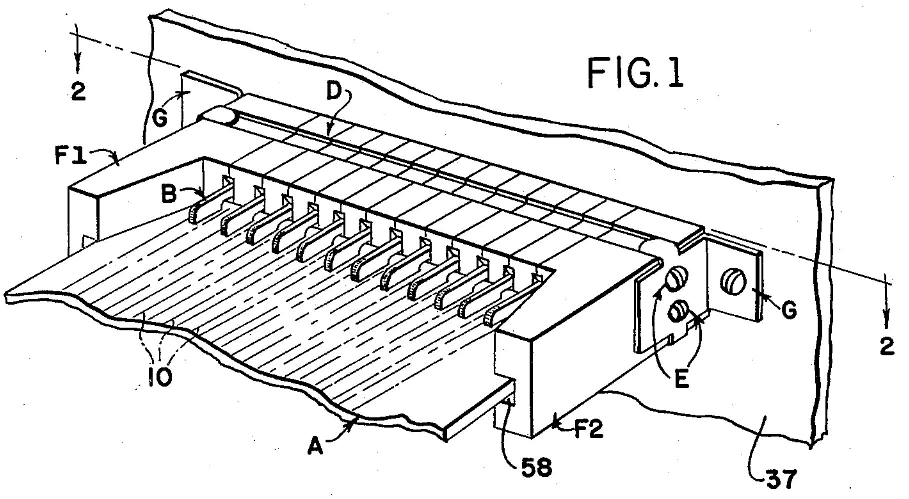
FIG. 1 is a perspective view of a printed circuit board and a detachable connector embodying my invention connected thereto.
Figure 4:
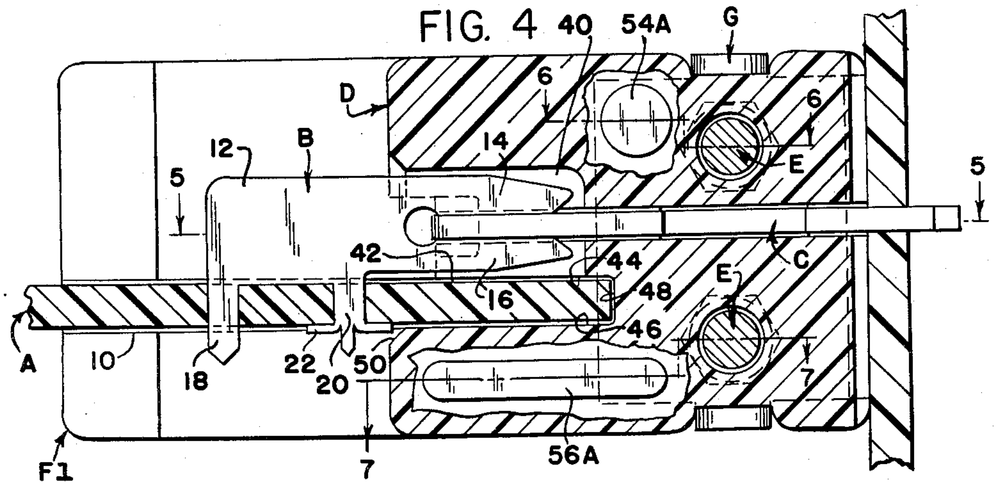
FIG. 4 is a sectional view taken along line 4—4 of FIG. 3.
Figure 5:
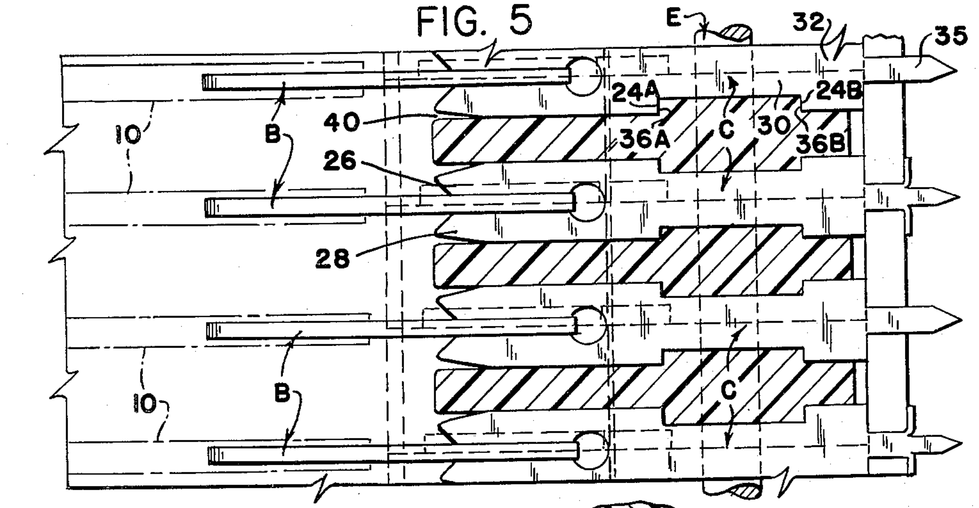
FIG. 5 is a sectional view taken along line 5—5 of FIG. 4.
Figure 7:
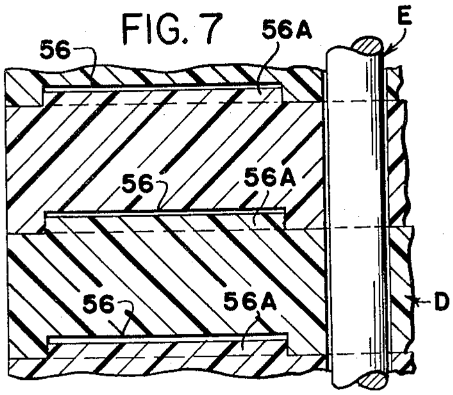
FIG. 7 is a sectional view taken along line 7—7 of FIG. 4.
Figure 6:
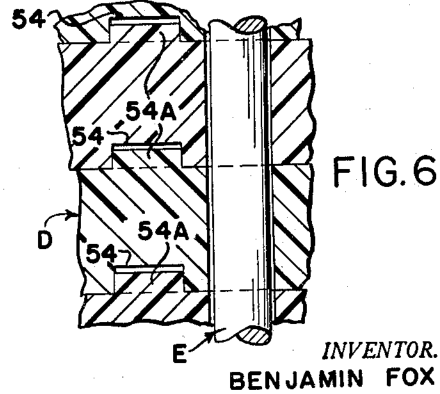
FIG. 6 is a sectional view taken along line 6—6 of FIG. 4.

Referring now in greater detail to the drawings, wherein similar reference characters refer to similar parts, I show a printed circuit board, generally designated as A, wherein conductive strips 10 affixed to the board A terminate in contacts, generally designated as B (see FIGS. 1, 4, and 5). The contacts are bifurcated and are splayed to the board as illustrated in FIG. 4. These contacts will be described in greater detail hereinafter.

The detachable quick connector contains a plurality of electrical contacts, each of which is generally designated as C. The contacts C interfit with, and are complementary to, the board contacts B, and the contacts C are suitably held in alignment by a plurality of insulating casing members or molded sections, generally designated as D. There are insulator end sections, generally designated as F1 and F2 which serve as guides and as supports for the board. The molded end caps or sections F1 and F2 and the intermediate sections D are suitably held together by through bolts and nuts, generally designated E, which hereinafter will be described in greater detail.

Each contact C is mounted between two casing members D of like construction. Each casing member D is molded of a plastic insulating material and is of a generally rectangular parallelepiped construction.

Figures 8, 9, 10, 11:
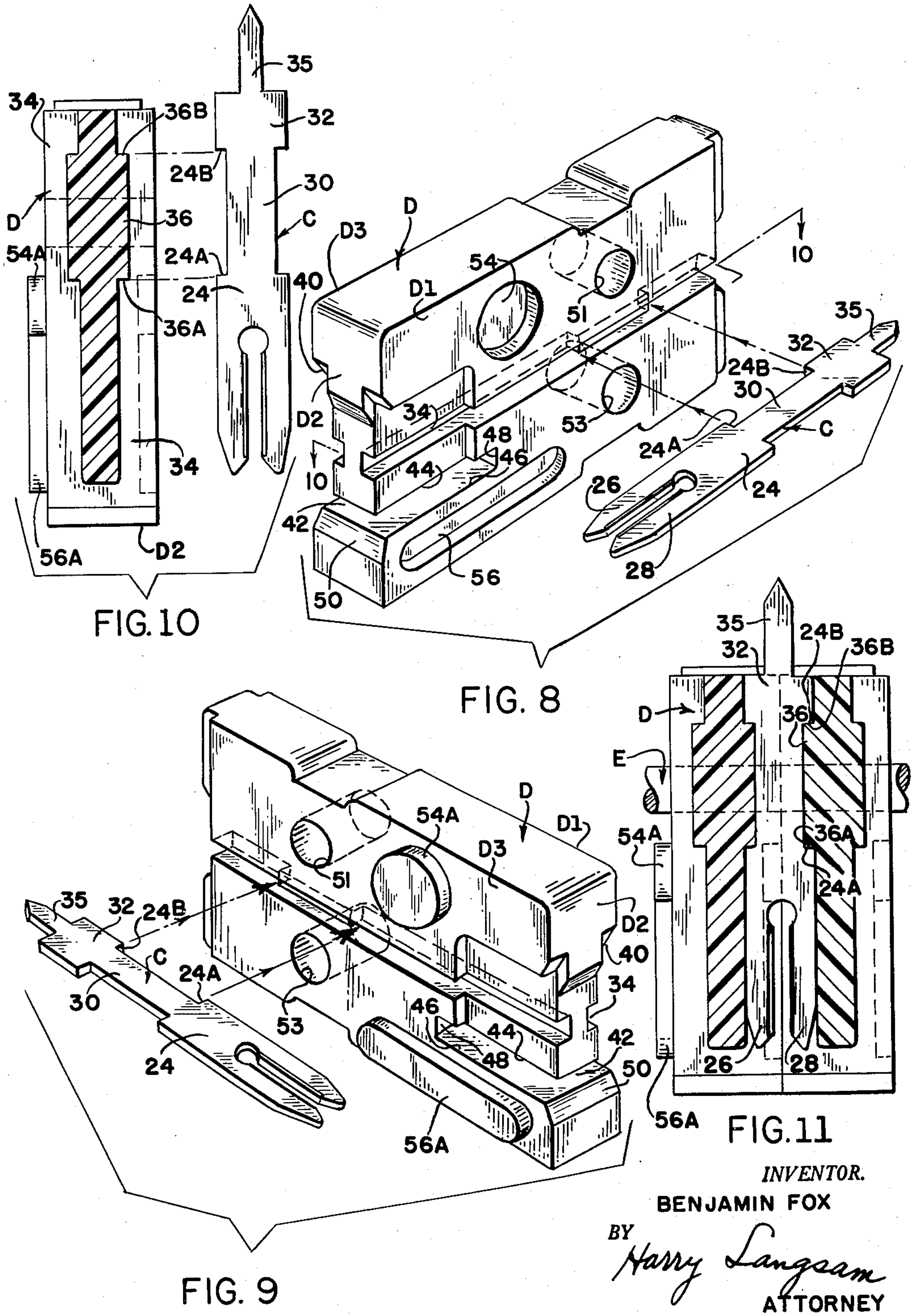
FIG. 8 is a perspective view of an electrical contact and one of the insulator casing members therefor.
FIG. 9 is a perspective view of the electrical contact and the other side of the insulator casing member shown in FIG. 8.
FIG. 10 is a sectional view taken along the line 10—10 of FIG. 8 with the electrical contact shown to one side.
FIG. 11 is a fragmentary sectional view showing an electrical contact supported between two insulator casing members to the present invention.
Figure 12:
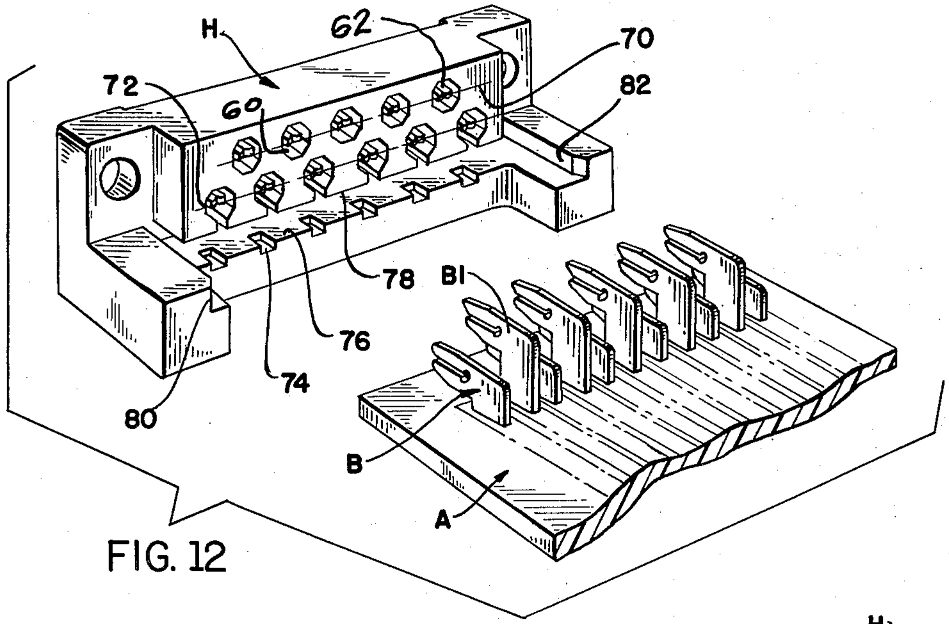
FIG. 12 is a modified form of perspective view of a detachable connector with staggered electrical contacts on a solid insulator block adapted to engage staggered contacts on a printed circuit board.
Figure 13:
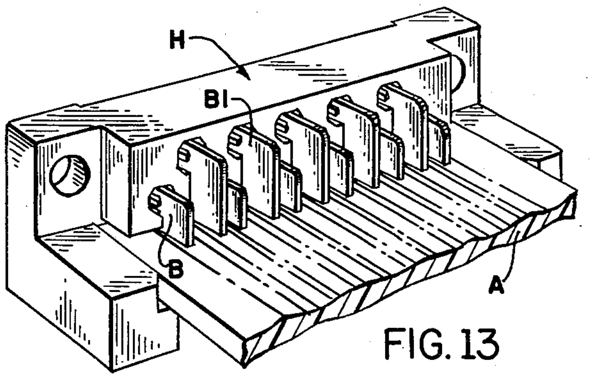
FIG. 13 is a perspective view of the connector of FIG. 12 and the printed circuit board in engaging relation.
Figure 14:
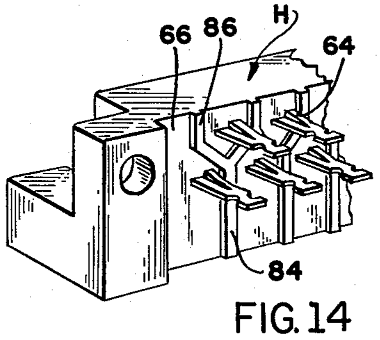
FIG. 14 is a fragmentary, rear perspective view of the printed circuit connector of FIG. 12.
Figure 15:
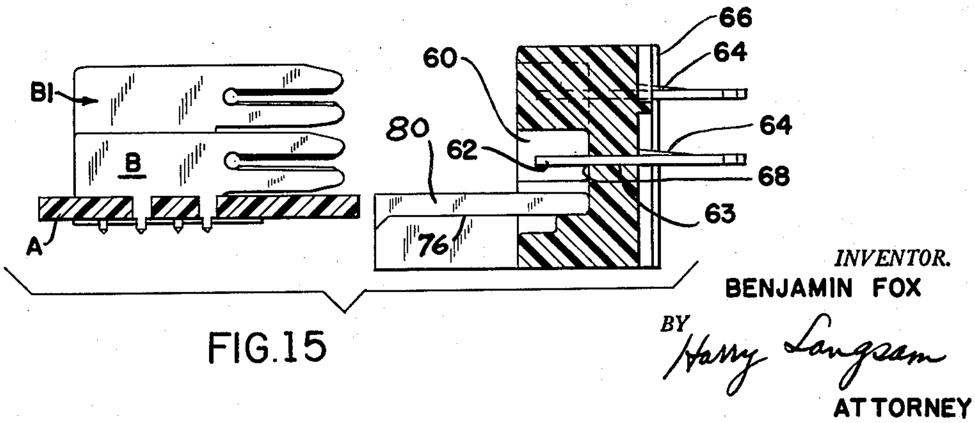
FIG. 15 is a fragmentary sectional view taken through the connector shown in FIG. 12.

The side D1 (FIG. 8) has a longitudinal slot 34 therein through the medial axis of the width to accommodate somewhat loosely the thickness of the contact C, and of a depth substantially equal to one-half of the width of the contact C. A projection 36 protrudes into the slot 34 and interfits somewhat loosely with the recess defined by the narrow neck 30 in the contact C so that the contact will be free to float. The edges 36A and 36B of the projection 36 (FIG. 10) prevent longitudinal movement of the contact C upon either application or removal of the connector by reason of the engagement of the shoulders 24A and 24B of the widened portions 24 and 32 of the contact C with the edges 36A and 36B of the extension on the contact.

Adjacent the front wall D2 of each intermediate section D, and within the side wall D1, and located above and below the slot 34, is a recessed portion 40 for the reception of the legs 14, 16 of the complementary connector B which interfits with the connector C (see FIG. 4).

Each flat, electrical contact or terminal B, made of a single, flat stamping of electrical conducting material, is substantially rigid and has a flat body 12 which has a bifurcation therein to define the pair of legs 14, 16 which interfit with another pair of legs of like construction of a contact C. These contacts are described in greater detail in my co-pending patent application Serial No. 383,053, filed September 29, 1953, now Patent No. 2,828,474, dated March 25, 1958.

Each contact B has a second pair of extensions 18, 20 which lie in the same plane as the body 12, but which extend from the body 12 at right angles to the direction in which the contact legs 14, 16 extend. The extensions 18, 20 serve to mount their respective contacts on the board A and to provide electrical engagement with the conductive strips 10. The extensions 18, 20 extend through the board A and are splayed to provide tabs 22 which are pressed firmly against the conductive strips 10 in order to affix the contacts B to the board A and provide electrical engagement with the conductive strips 10 (FIG. 4).

Each complementary electrical contact or terminal C (FIG. 8), which interfits with a terminal B, has a stamped out body 24 with the contact legs 26, 28 projecting from one end. The body 24 narrows at 30 as previously indicated and then widens again at 32 with a narrow tail or holding extension 35. The tail 35 is adapted to be splayed to a vertically positioned printed connector board 37 which may have cross-over connections as in the prior art patent to O'Brien, No. 2,019,625.

Beneath the longitudinal side slots 34 of each connector section D, and extending from the front wall D2, is a slot 42 which receives the board A. The slot 42 is defined by the horizontal walls 44, 46 and the joining wall 48, the latter limiting the projection of the board A into the connectors. A chamfered surface 50 aids in the application of the connector to the printed circuit board.

The vertical wall D1 has two through openings 51, 53 through which the holding bolts E pass, a circular recess 54 above the longitudinal side recesses 34, and elongated, narrow recesses 56 therein beneath the side recesses 34. The recesses 56 and the recess 54 respectively serve as aligning guides for a complementary, elongated projection 56A and a circular projection 54A in the adjoining or second vertical wall D3 which is parallel to the wall D1. The interfitting recesses and projections of adjacent casing members align and interlock the adjacent casing members so that the contacts C may be interlocked therebetween, and prevent the adjacent casings from turning or otherwise moving with respect to each other.

Large end caps, generally designated F1 and F2, are molded of plastic insulating material with one cap F1 being for the left hand side and the other cap F2 being for the right hand side of the connector. The left hand cap F1 has complementary aligning recesses to receive the projections 54A, 56A from the side D3 of the adjacent casing member D, and the right hand cap F2 has complementary projections to interfit into the recesses in the right hand side D1 of the casing member adjacent to it.

A pair of bolt receiving holes are provided in the end caps. Each end cap has an elongated slot 58 to receive one side of the printed circuit board in order to guide the connector upon the board and insure proper alignment and mating of cooperating pairs of contacts B and C.

Figure 2:
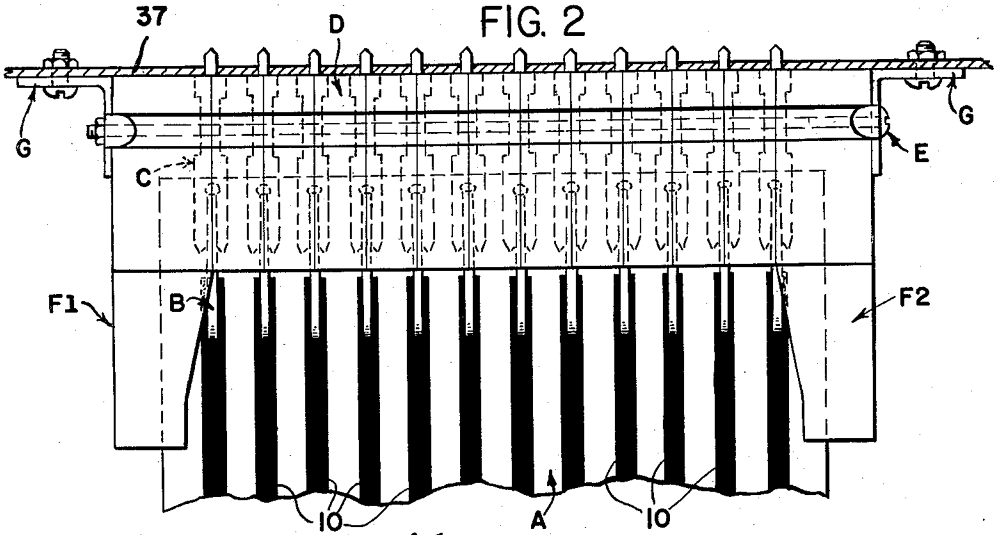
FIG. 2 is a sectional view taken along line 2—2 of FIG. 1.
Figure 3:
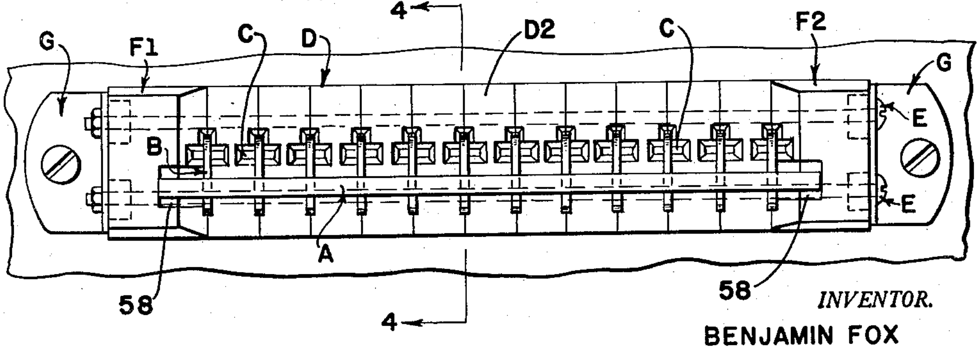
FIG. 3 is a front view showing a printed circuit board connected to the detachable connector embodying my invention.

Metal end brackets, generally designated G, at times serve as mounting brackets. In FIG. 2, the connector is shown attached to the panel 37 by means of holding nuts and bolts passing through the brackets G.

In FIGS. 12 to 15, I disclose a modification of my invention wherein the quick detachable connector embodies a single insulator casing, generally designated H, which has a plurality of horizontally extending through openings 60 each of which encloses the bifurcated end 62 of a horizontally disposed electrical contact C1. Communicating with each opening 60 is a rectangular opening 63 in which the rectangular peripheral wall portion of a contact C1 is disposed.

The rear end of each contact C1 has a split portion 64 which is spread to engage the wall 66 of the casing H whereby the contact cannot be pulled from the front of the casing H. A wide shoulder 68 on the forward end of the contact is adapted to abut the front wall of the insulator casing H to prevent the contact from being pulled outwardly.

The contacts are arranged in two tiers 70 and 72, but in staggered relationship in a vertical plane. That is, the contacts are in different vertical planes to meet the staggered printed circuit contacts B and B1.

A recess 74 enables the splayed end of the conductive strip board A to rest upon the ledge 76 which forms one resting portion, and a second spaced ledge 78 serves as a guide wall for the board A. The end walls 80, 82 of the casing H determine the transverse position of the board A in relation to the quick detachable connector casing H and insure alignment of the various contacts B, B1 and C1.

To prevent voltage creepage, I employ dividing walls 84, 86 on the rear surface of the integrally molded quick detachable connector between the various contacts C1 thereof.

By using the staggered contacts, it is possible to obtain more contacts per inch of length of the connector.

Although my invention has been described in considerable detail, such description is intended as being illustrative rather than limiting, since the invention may be variously embodied, and the scope of the invention is to be deteremined as claimed.

I claim as my invention:

1. An electrical connector comprising a plurality of aligned insulator casing members of like construction, each said casing member being of generally parallelepiped configuration and having a longitudinal side slot along each side wall thereof, and a plurality of flat, electrical contacts each having a pair of opposed side recesses therein at a portion intermediate its length, the side portions of said contacts being disposed in said side slots, each said casing member having an projection in each of its said side slots, said projections fitting within said contact side recesses, said casing members having aligned slots in the forward walls thereof for receiving a portion of a printed circuit board, and complementary, interfitting recesses and extensions on adjacent ones of said casing members aligning said casing members with each other and preventing them from moving with respect to each other.

2. An electrical connector according to claim 1 including end caps connected to and aligned with said aligned casing members, said end caps having side slots for receiving the side edges of said printed circuit board whereby said contacts will be aligned with cooperating contacts on said printed circuit board.

3. An electrical connector according to claim 1 wherein said contacts have bifurcated ends adjacent said casing member forward walls, and wherein said casing members have recesses therein at said forward walls adjacent said side slots for reception therein of flat contacts carried by said printed circuit board whereby said last named contacts may be engaged with said first named contacts at said bifurcated ends thereof.

4. An electrical coupling device for a printed circuit board having a plurality of electrical contacts mounted thereon adjacent an edge thereof, said coupling device comprising, in combination, a plurality of flat electrical contacts having side indentations therein, a pair of separable casing members for each of said flat contacts having opposed, complementary contact receiving slots in the opposed surfaces thereof, each pair of said casing members having projections in said slots thereof engaging and locking with said side indentations of one of said flat contacts therebetween, and means to align said casing members together, said casing members also having aligned slots therein in the forward walls thereof for receiving said printed circuit board edge in position to cause said printed circuit board contacts to engage said coupling device contacts.

5. An electrical coupling device for a printed circuit board having an electrical contact mounted thereon adjacent an edge thereof, said coupling device comprising, in combination, a pair of separable casing members adapted to be assembled in contacting relation and having opposed, complementary contact receiving slots in the opposed surfaces thereof, and a flat contact member mounted in said slots, said contact member having a portion of relatively reduced width, said casing members having cooperating projections in said slots engaging said contact member at said reduced width portion thereof, said casing members also having aligned recesses in the sides thereof extending inwardly from the front walls thereof for reception of said printed circuit board contact at right angles to and in engagement with said contact member, and said casing members also having aligned slots therein in the forward walls thereof to receive said printed circuit board when said contact thereof and said contact member are brought into said engagement.

6. An electrical coupling device for a printed circuit board having an electrical contact mounted thereon adjacent an edge thereof, said coupling device comprising, in combination, a pair of separable casing members adapted to be assembled in contacting relation and having opposed, complementary contact receiving slots in the opposed surfaces thereof, and a flat contact member mounted in said slots, said contact member having a portion of relatively reduced width, said casing members having cooperating projections in said slots engaging said contact member at said reduced width portion thereof, said casing members also having aligned recesses in the sides thereof extending inwardly from the front walls thereof for reception of said printed circuit board contact at right angles to and in engagement with said contact member, and said casing members also having aligned slots therein the forward walls thereof to receive said printed circuit board when said contact thereof and said contact member are brought into said engagement, said contact member being loosely confined in said slots against removal therefrom when said casing members are assembled therewith, the loose confinement of said contact member in said slots affording freedom of said contact member to float in said slots.

7. An electrical connector comprising, in combination, a casing having a front edge, at least one internal cavity in said front edge, at least one internal electrical contact in said casing, said internal contact having an engagement portion positioned within said cavity, a pair of laterally spaced external guide means extending forwardly from said front edge of the casing, a channel having a laterally opening slot in each of said guide means, the lateral slot of one of said channels facing and being aligned with the lateral slot in the other of said channels, a substantially flat board constructed of insulating material and having an upper surface, a lower surface and an edge portion, at least one exposed external electrical contact on said upper surface adjacent said edge portion, said external contact having an exposed support portion and an exposed engaging portion for engaging with the internal contact in said casing, said engaging portion extending from said support portion in a direction parallel to and at least partially overlying but spaced from the upper surface of said board, opposite edges of said board being insertable into and slidably movable within said channels, said external contact on said board being engageable in said cavity with the engagement portion of the internal contact in said casing upon movement of said board toward said casing between said guide means, and stop means in said casing adjacent said cavity to limit movement of said board toward said casing after engagement between said contacts has taken place.

8. The electrical connector of claim 7 wherein there is a plurality of cavities in the front edge of said casing, a corresponding number of internal contacts in said casing, each with an engagement portion in the respective cavity, and a corresponding number of external contacts on said board.

9. The electrical connector of claim 8 wherein the cavities and their corresponding internal contacts in said casing are arranged in a plurality of parallel rows with the cavities and contacts of each row being staggered relative to the cavities and contacts of the other rows, and wherein the external contacts on said board are arranged in parallel rows of relatively staggered contacts corresponding in position with the cavities and internal contacts in said casing.

10. An electrical connector assembly comprising a generally flat board constructed of insulating material and having an upper surface, a lower surface and an edge portion, at least one exposed electrical contact mounted on said upper surface adjacent said edge portion, said contact comprising a single, relatively thin, uniplanar, flat strip, one portion of said strip being an exposed support portion and the other portion of said strip being an exposed mating portion, said mating portion being spaced from and extending parallel to said upper surface of said board toward said edge portion of the board and being constructed to positively engage a complementary contact extending from the opposite direction, said support portion having a lower edge in substantial line abutment with said upper surface of the board, a plurality of spaced, distortable legs integral with and depending from said lower edge of said support portion, each leg being in the same flat plane with said support portion and extending through a corresponding aperture in said board to said lower surface thereof, each leg being staked to said board in engagement with said lower surface, and at least one electrical conductor on said board, each of said legs being directly connected to said conductor.

11. The electrical connector assembly of claim 10 wherein said electrical conductors comprise electrically conductive strips on at least one surface of said board.

References Cited in the file of this patent

UNITED STATES PATENTS

| | | |
|---|---|---|
| Re. 23,547 | Fox | Sept. 9, 1952 |
| 2,189,874 | Ziganke | Feb. 13, 1940 |
| 2,326,237 | Brewer | Aug. 10, 1943 |
| 2,465,540 | Korn | Mar. 29, 1949 |
| 2,530,945 | Chapman et al. | Nov. 21, 1950 |
| 2,613,244 | Del Camp | Oct. 7, 1952 |
| 2,641,747 | Johanson | June 9, 1953 |
| 2,709,247 | Alden | May 24, 1955 |
| 2,754,453 | Noell | July 10, 1956 |
| 2,754,454 | McNutt | July 10, 1956 |
| 2,765,450 | Richardson | Oct. 2, 1956 |
| 2,783,417 | Eannarino | Feb. 26, 1957 |
| 2,832,013 | Pedersen et al. | Apr. 22, 1958 |
| 2,946,976 | Blain | July 26, 1960 |

OTHER REFERENCES

Buggie, H. H. "Electronic Components News," March 1954, pp. 1 and 2.